United States Patent [19]

Schwob

[11] 4,455,473

[45] Jun. 19, 1984

[54] HEAT DISSIPATOR FOR THE ELECTRONIC CIRCUIT OF A LAUNDRY IRON

[75] Inventor: Pierre Schwob, Lyons, France

[73] Assignee: SEB S.A., Selongey, France

[21] Appl. No.: 361,080

[22] Filed: Mar. 23, 1982

[30] Foreign Application Priority Data

Apr. 10, 1981 [LU] Luxembourg ............. 83292

[51] Int. Cl.³ ............. H05B 1/02; D06F 75/34; F28F 1/00
[52] U.S. Cl. ............. 219/245; 219/250; 219/258; 219/241
[58] Field of Search ............. 361/381, 386, 387, 395, 361/399; 165/80 A, 80 B, 80 D, 185; 219/241, 250, 251, 252, 253, 245, 258; 357/80, 81; 174/35 R

[56] References Cited

U.S. PATENT DOCUMENTS

| | | | |
|---|---|---|---|
| 2,745,895 | 5/1956 | Lideen | 165/80 B |
| 2,893,704 | 7/1959 | Passman | 165/80 B |
| 3,193,610 | 7/1965 | Worden | 165/80 B |
| 3,391,242 | 7/1968 | Sudges | 357/81 |
| 4,103,737 | 8/1978 | Perkins | 165/80 |
| 4,203,147 | 5/1980 | Gabr | 361/395 |
| 4,217,624 | 8/1980 | Tuck | 361/395 |
| 4,347,428 | 8/1982 | Conrad | 219/251 |

FOREIGN PATENT DOCUMENTS

| | | |
|---|---|---|
| 7924293 | 8/1979 | Fed. Rep. of Germany . |
| 7924294 | 8/1979 | Fed. Rep. of Germany . |
| 2396489 | 1/1979 | France . |

OTHER PUBLICATIONS

Larson, W. B., "Heat Sink Technique for Electrical Components," IBM Technical Disclosure Bulletin, vol. 23, No. 9, Feb. 1981.

*Primary Examiner*—B. A. Reynolds
*Assistant Examiner*—Teresa J. Walberg
*Attorney, Agent, or Firm*—Young & Thompson

[57] ABSTRACT

The electronic circuit of a laundry iron comprises at least one heat-generating element such as a triac or a dropping resistor. The heat dissipator comprises a tubular metallic casing which contains the electronic circuit and is housed within the handle of the laundry iron. The internal cross-section of the handle is similar in shape to the external cross-section of the tubular casing and a thermal bond is provided between the casing and the handle.

4 Claims, 4 Drawing Figures

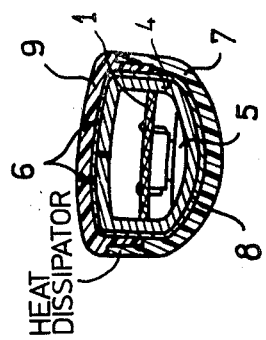
FIG._2
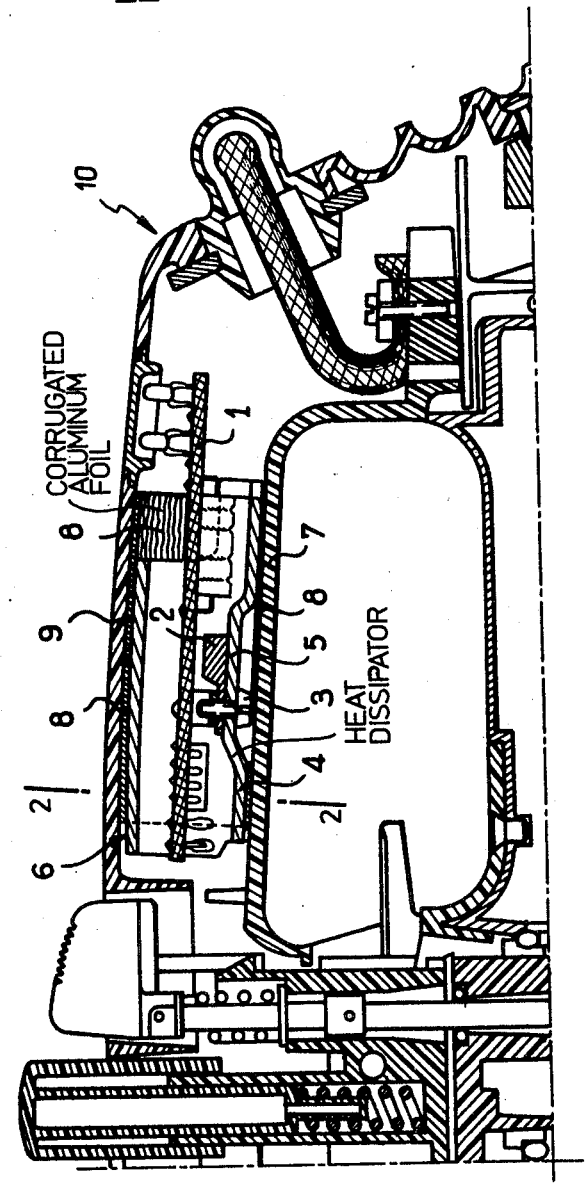
FIG._1

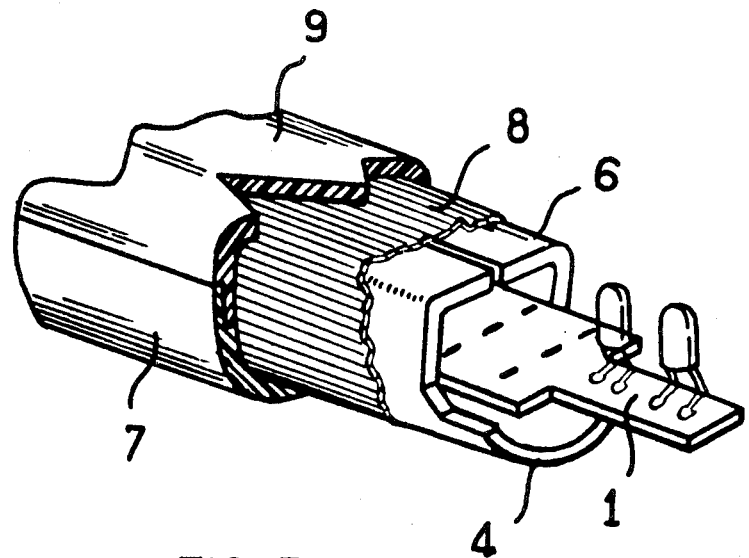
FIG_3
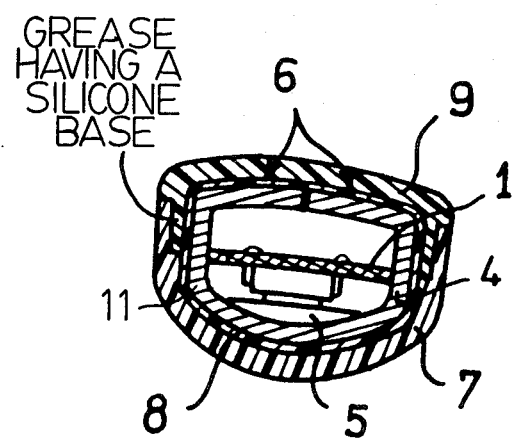
FIG_4

HEAT DISSIPATOR FOR THE ELECTRONIC CIRCUIT OF A LAUNDRY IRON

This invention relates to a heat dissipator for the electronic circuit of a laundry iron.

The invention further relates to a laundry iron which makes use of a heat dissipator of this type.

Electronic regulating circuits usually comprise a cut-off stage which is often a triac as well as a resistor for producing a voltage drop, or so-called dropping resistor. Elements of this type, however, have the effect of generating heat and the good performance of semiconductor components is dependent on the need to ensure heat removal.

With this objective, it is a known practice to make use of heat dissipators consisting of metallic components which have the effect of absorbing the heat produced and releasing it into the surrounding air by convection and radiation. To this end, said dissipators are provided with fins and have a state of surface which is characterized by high emissivity.

However, in laundry irons, available space is usually too limited to accommodate a heat dissipator of this type. Furthermore, the inevitable proximity of the useful heat source gives rise to a further difficulty which makes it necessary to form an external protuberance on the laundry-iron body in order to house the dissipator.

The object of the present invention is to provide a dissipator which remains fully effective while being of sufficiently small size to be readily housed within the body of a conventional laundry iron.

In accordance with the invention, the heat dissipator for an electronic circuit comprising at least one heat-generating element such as a triac or a dropping resistor in turn comprises a tubular casing which contains said electronic circuit. The distinguishing feature of the heat dissipator lies in the fact that said tubular casing is metallic and housed within the handle of the laundry iron. The internal cross-section of said handle is similar in shape to the external cross-section of the tubular casing and a thermal bond is provided between said casing and the handle of the laundry iron.

Dissipation of heat takes place by conduction through the handle towards the operator's hand but does not cause any discomfort or result in any additional bulk.

Preferably, the thermal bond is established by means of a corrugated metallic sheet inserted between the tube and the handle or by interposition of grease having a silicone base.

These and other features of the invention will be more apparent to those skilled in the art upon consideration of the following description and accompanying drawings, wherein:

FIG. 1 is a partial longitudinal sectional view of a laundry iron according to the invention;

FIG. 2 is a sectional view of the handle, taken along line 2-2 of FIG. 1;

FIG. 3 is a cutaway part-sectional view of the handle; and

FIG. 4 is a view similar to FIG. 2 but showing a modified form of the invention.

Referring to these figures, a small insulating plate 1 of the printed circuit is adapted to carry a triac 2. Said triac is attached by means of a screw 3 to an aluminum sheet member 4 which constitutes the heat dissipator. Said sheet member is die-stamped and folded so as to form a tubular casing 6, the small plate 1 which supports the electronic components being placed within said casing. A flat portion 5 is formed by die-stamping in order to house the head of the screw 3.

The external shape of the casing 6 is similar to the internal shape of the handle 7,9 of a laundry iron 10 within which said casing is fitted in such a manner as to leave a small clearance for the insertion of a thin corrugated aluminum sheet 8. At the time of positioning, the subassembly 1,6 is rolled within the thin corrugated sheet 8 and forcibly inserted in a fixed portion 7 of the handle. A detachable portion 9 of the handle is then fitted in position and powerfully applied against the assembly which has been inserted. This mode of operation has the effect of flattening the corrugations of the thin sheet 8 to a certain extent. A permanent contact is thus established over a large internal surface area of the handle, thereby facilitating heat transmission to the exterior and ensuring satisfactory heat removal but without causing any uncomfortable heat sensation when handling the iron.

If a dropping resistor forms part of the electronic circuit, the heat produced by said resistor is transferred to the metallic mass of the casing 6 by radiation and convection.

It would also be possible to give the tubular casing 6 a shape such that this latter fits exactly within the handle 7,9. Taking the dimensional tolerances of the parts into account, the thermal contact thus achieved would be less reliable, however, than the thermal contact established by means of a predetermined clearance space which is filled with deformable and resilient material having good heat conductivity.

As can readily be understood, the invention is not limited to the example described in the foregoing but extends to all minor variants within the capacity of those versed in the art. It accordingly follows that the corrugated aluminum sheet 8 can be replaced by any other material such as brass, copper or any other metallic or nonmetallic heat-conducting component having mechanical or thermal characteristics which meet requirements.

One form of construction which is particularly advantageous when the internal shapes of the handle 7,9 are not readily reproducible for such reasons as dimensional variations caused by shrinkage of constituent material consists in interposing grease 11 having a silicone base between the subassembly 1,6 and the internal wall of the handle 7,9. It is in fact known that grease of this type is designed to ensure relatively satisfactory heat transfer. Grease of this type has the advantage of filling interstices having variable shapes. Suitable products which are also available for this purpose include plastic compounds having good heat conductivity and employed in the chemical industry as well as resins filled with metal powder having sufficient plasticity at the time of positioning of the subassembly 1,6 within the handle 7,9.

The casing 6 can have any profile imposed by the configuration of the small plate 1 or the structure of the handle 7,9. In particular, said casing can have a more or less open cross-section such as a U-shaped cross-section or can be made up of a plurality of elements.

What is claimed is:

1. A laundry iron, comprising an electronic regulating circuit having at least one heat-generating element, said electronic regulating circuit being contained in a metallic tubular casing housed within a hollow handle of said laundry iron, the interior of said handle being similarly shaped as the exterior of the tubular casing, and a thermal bond between said casing and said handle.

2. A laundry iron according to claim 1, wherein the thermal bond comprises a corrugated metallic sheet.

3. A laundry iron according to claim 1, wherein the thermal bond comprises a grease having a silicone base.

4. A laundry iron according to claim 1, wherein the heat-generating element is attached directly to the tubular casing.

* * * * *